(12) United States Patent
Cho et al.

(10) Patent No.: US 11,094,882 B2
(45) Date of Patent: Aug. 17, 2021

(54) METHOD OF MANUFACTURING MEMORY DEVICE

(71) Applicant: SAMSUNG ELECTRONICS CO., LTD., Suwon-si (KR)

(72) Inventors: Jung-hyun Cho, Anyang-si (KR); Song-yi Kim, Yongin-si (KR); Masayuki Terai, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 16/360,500

(22) Filed: Mar. 21, 2019

(65) Prior Publication Data

US 2020/0083448 A1    Mar. 12, 2020

(30) Foreign Application Priority Data

Sep. 10, 2018    (KR) .................. 10-2018-0107888

(51) Int. Cl.
*H01L 23/522*     (2006.01)
*H01L 45/00*      (2006.01)
*H01L 43/12*      (2006.01)

(52) U.S. Cl.
CPC .......... *H01L 45/1641* (2013.01); *H01L 43/12* (2013.01); *H01L 45/06* (2013.01); *H01L 45/1616* (2013.01)

(58) Field of Classification Search
CPC ........... H01L 21/3003; H01L 21/28176; H01L 21/76829; H01L 27/222
See application file for complete search history.

(56) References Cited

U.S. PATENT DOCUMENTS

| 6,465,826 | B2   | 10/2002 | Kasai |
| 6,627,462 | B1 * | 9/2003  | Yang ................. H01L 21/76832 438/3 |
| 8,492,808 | B2 * | 7/2013  | Omori ................ H01L 23/5226 257/295 |
| 8,669,644 | B2 * | 3/2014  | Basim ............... H01L 21/02274 257/635 |
| 9,218,981 | B2   | 12/2015 | Basim et al. |
| 9,673,253 | B2   | 6/2017  | Hara et al. |
| 9,722,096 | B2   | 8/2017  | Kawashima et al. |

(Continued)

FOREIGN PATENT DOCUMENTS

| KR | 10-2001-0058448 | 7/2001 |
| KR | 10-0790235      | 12/2007 |

(Continued)

*Primary Examiner* — Bradley Smith
*Assistant Examiner* — David J Goodwin
(74) *Attorney, Agent, or Firm* — F. Chau & Associates, LLC

(57) ABSTRACT

A method of manufacturing a memory device includes forming a transistor on a substrate, forming a lower interlayer insulating layer covering the transistor, forming a hydrogen supply layer on the lower interlayer insulating layer, forming a hydrogen blocking layer on the hydrogen supply layer, annealing the transistor, the lower interlayer insulating layer, and the hydrogen supply layer, forming a memory cell on the hydrogen blocking layer after the annealing, and forming an upper interlayer insulating layer surrounding the memory cell and having a third average hydrogen concentration less than the second average hydrogen concentration.

18 Claims, 17 Drawing Sheets

(56) References Cited

U.S. PATENT DOCUMENTS

| | | | |
|---|---|---|---|
| 2004/0253807 A1* | 12/2004 | Thei | H01L 21/76877 438/627 |
| 2005/0009210 A1* | 1/2005 | Hosotani | G11C 11/16 438/3 |
| 2005/0202686 A1* | 9/2005 | Saki | H01L 21/2254 438/783 |
| 2007/0161258 A1* | 7/2007 | Nam | H01L 21/76828 438/783 |
| 2011/0079884 A1* | 4/2011 | Basim | H01L 21/0217 257/632 |
| 2012/0142177 A1 | 6/2012 | Kim et al. | |
| 2012/0175689 A1 | 7/2012 | Basim et al. | |
| 2019/0221732 A1* | 7/2019 | Houssameddine | G11C 11/161 |
| 2019/0221736 A1* | 7/2019 | Houssameddine | H01L 27/228 |
| 2019/0312035 A1* | 10/2019 | Takuma | H01L 25/0652 |

FOREIGN PATENT DOCUMENTS

| | | |
|---|---|---|
| KR | 10-2008-0073581 | 8/2008 |
| KR | 10-2008-0083479 | 9/2008 |
| KR | 10-2009-0115011 | 11/2009 |

\* cited by examiner ns
US 11,094,882 B2

METHOD OF MANUFACTURING MEMORY DEVICE

CROSS-REFERENCE TO RELATED APPLICATION

This application claims the benefit under 35 U.S.C. § 119 of Korean Patent Application No. 10-2018-0107888, filed on Sep. 10, 2018, in the Korean Intellectual Property Office, the disclosure of which is incorporated by reference herein in its entirety.

TECHNICAL FIELD

Exemplary embodiments relate to a method of manufacturing a memory device, and more particularly, to a method of manufacturing a memory device having a cell on peripheral (COP) structure.

DISCUSSION OF RELATED ART

A memory device having a COP structure has been developed wherein a peripheral circuit is formed under a memory cell. The COP structure permits smaller, highly integrated memory devices to be produced. The COP structure reduces the amount of space required for the memory device. Accordingly, the COP structure may be suitable for smaller and highly integrated memory devices.

SUMMARY

According to an exemplary embodiment of the present disclosure, a method of manufacturing a memory device includes: forming a transistor on a substrate; forming a lower interlayer insulating layer covering the transistor; forming a hydrogen supply layer on the lower interlayer insulating layer; forming a hydrogen blocking layer on the hydrogen supply layer; annealing the transistor, the lower interlayer insulating layer and the hydrogen supply layer; forming a memory cell on the hydrogen blocking layer after the annealing of the transistor, the lower interlayer insulating layer and the hydrogen supply layer; and forming an upper interlayer insulating layer surrounding the memory cell.

According to another exemplary embodiment of the present disclosure, a method of manufacturing a memory device includes: forming a transistor on a substrate; forming a lower interlayer insulating layer covering the transistor; forming at least one intermediate interlayer insulating layer on the lower interlayer insulating layer; forming a hydrogen supply layer on the at least one intermediate interlayer insulating layer; forming a hydrogen blocking layer on the hydrogen supply layer; annealing the transistor, the lower interlayer insulating layer, and the hydrogen supply layer; forming a memory cell on the hydrogen blocking layer after the annealing of the transistor, the lower interlayer insulating layer and the hydrogen supply layer; and forming an upper interlayer insulating layer that surrounds the memory cell.

According to yet another exemplary embodiment of the present disclosure, a method of manufacturing a memory device includes: forming a transistor on a substrate; forming a lower interlayer insulating layer covering the transistor; forming a hydrogen supply layer on the lower interlayer insulating layer; forming a hydrogen blocking layer on the hydrogen supply layer; annealing the transistor, the lower interlayer insulating layer and the hydrogen supply layer; removing the hydrogen blocking layer; removing the hydrogen supply layer; forming at least one additional interlayer insulating layer on the lower interlayer insulating layer; forming a memory cell on the at least one additional interlayer insulating layer after the annealing of the transistor, the lower interlayer insulating layer and the hydrogen supply layer; and forming an upper interlayer insulating layer surrounding the memory cell.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
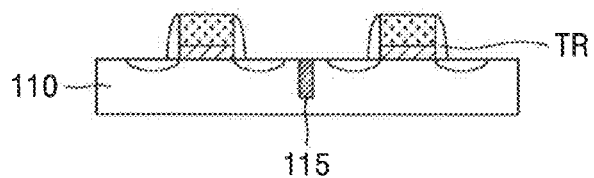
FIGS. 1A through 1F are cross-sectional views illustrating a method of manufacturing a memory device, according to an exemplary embodiment of the present disclosure.

Referring to FIG. 1A, a device isolation layer 115 may be formed in a substrate 110. The substrate 110 may include a semiconductor material. In one exemplary embodiment, the semiconductor material is a Group IV semiconductor material, a Group III-V semiconductor material, or a Group II-VI semiconductor material. For example, the Group IV semiconductor material may include silicon (Si), germanium (Ge) Si—Ge. For example, the Group III-V semiconductor material may include gallium arsenide (GaAs), indium phosphide (InP), galliaum phosphide (GaP), indium arsenide (Ines), indium antimonide (InSb) or indium gallium arsenide (FnGaAs). For example, the Group II-VI semiconductor material may include zinc telluride (ZnTe) or cadmium sulfide (CdS). In one exemplary embodiment, the substrate 110 may include a bulk wafer or an epitaxial layer. In one exemplary embodiment, the device isolation layer 115 may include silicon nitride, silicon oxide or a combination thereof.

In addition, one or more transistors TR forming a peripheral circuit of a memory device may be formed on the substrate 110. The transistors TR may each include a source, a drain, a gate, a gate insulating layer and a gate spacer.

Figure 1B:
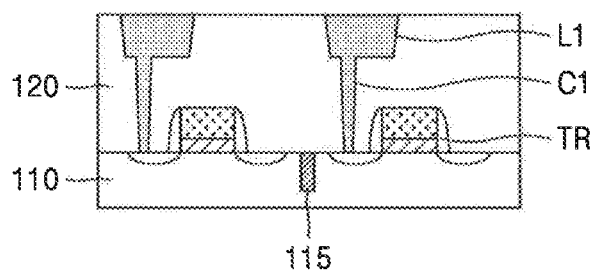

Referring to FIG. 1B, a lower interlayer insulating layer 120 covering the transistors TR may be formed. In one exemplary embodiment, the lower interlayer insulating layer 120 may include silicon oxide, silicon nitride or a combination thereof. In one exemplary embodiment, the lower interlayer insulating layer 120 may be formed by a chemical vapor deposition (CVD) method, a plasma enhanced vapor deposition (PECVD) method, an evaporation method, a sputtering method, an atomic layer deposition (ALD) method or a combination thereof.

In addition, one or more first contacts C1 and one or more first conductive lines L1 may be formed in the lower interlayer insulating layer 120. The first contacts C1 may connect the transistors TR and the first conductive lines L1. In one exemplary embodiment, the first contacts C1 and the first conductive lines L1 may each include aluminum (Al), copper (Cu), tungsten (W), gold (Au), silver (Ag) or a combination thereof. The first contacts C1 and the first conductive lines L1 may further include barrier layers on surfaces of the first contacts C1 and the first conductive lines L1. The barrier layer may include titanium nitride (TiN), tantalum nitride (TaN) or a combination thereof. In one exemplary embodiment, the first contacts C1 and the first conductive lines L1 may respectively be formed by a damascene process. In another exemplary embodiment, the plurality of first contacts C1 and the plurality of first conductive lines L1 may be simultaneously formed by a dual damascene process.

Figure 1C:
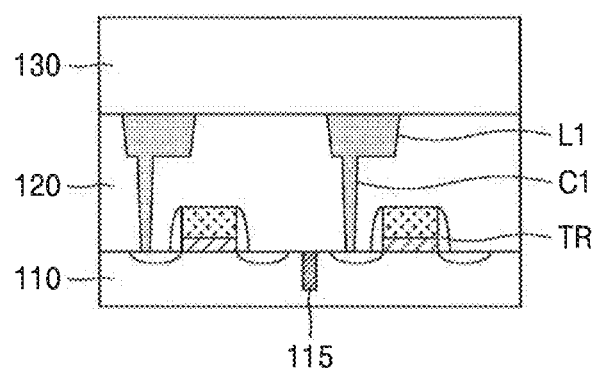

Referring to FIG. 1C, a hydrogen supply layer 130 may be formed on the lower interlayer insulating layer 120. The hydrogen supply layer 130 may include silicon oxide and hydrogen. In one exemplary embodiment, the hydrogen supply layer 130 may include hydrogen having a concentration from about 20 at % to about 40 at %. In one exemplary embodiment, the hydrogen supply layer 130 may be formed by a PECVD method under a temperature from about 100° C. to about 400° C.

Figure 1D:
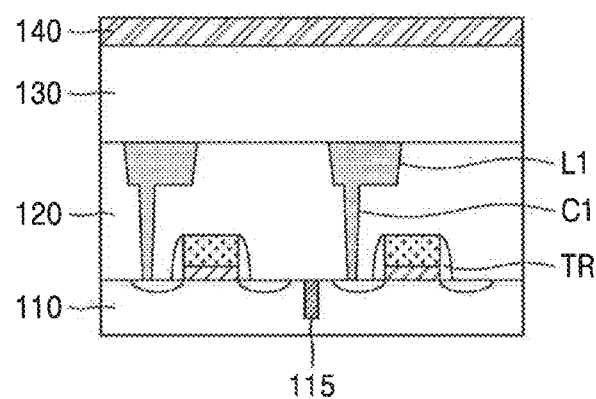

Referring to FIG. 1D, a hydrogen blocking layer 140 may be formed on the hydrogen supply layer 130. In one exemplary embodiment, the hydrogen blocking layer 140 may, include silicon nitride. In one exemplary embodiment, the hydrogen blocking layer 140 may be formed by a PECVD method under a temperature from about. 100° C. to about 400° C.

The transistors TR, the lower interlayer insulating layer 120 and the hydrogen supply layer 130 may undergo an annealing process. In one exemplary embodiment, the annealing process may be performed under a temperature from about 300° C. to about 500° C., for about one hour to four hours. In one exemplary embodiment, the annealing process may be performed under a nitrogen atmosphere.

Figure 2A:
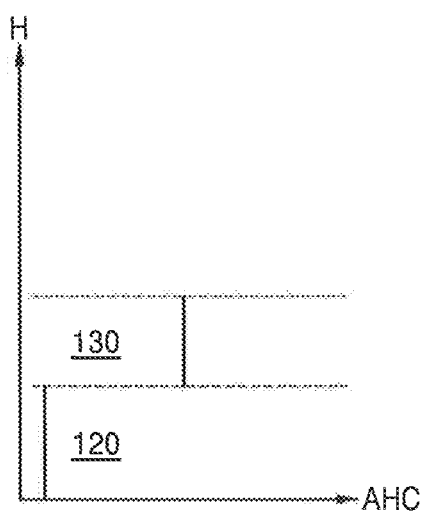
FIG. 2A is a graph of example average hydrogen concentrations before an annealing process, according to an exemplary embodiment of the present disclosure.
Figure 2B:
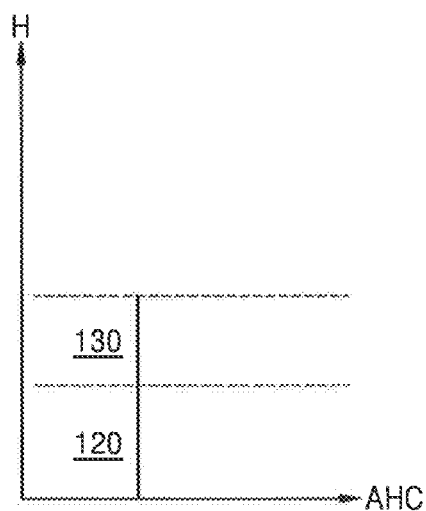
FIG. 2B is a graph of example average hydrogen concentrations after the annealing process, according to an exemplary embodiment of the present disclosure.

During the annealing process, hydrogen in the hydrogen supply layer 130 may be diffused into the lower interlayer insulating layer 120. FIG. 2A shows average hydrogen concentrations (AHC) according to heights H from the substrate 110 before the annealing process. Referring to FIG. 2A, before the annealing process, an AHC of the hydrogen supply layer 130 is higher than an AHC of the lower interlayer insulating layer 120. For example, in one exemplary embodiment, the AHC of the lower interlayer insulating layer 120 may be approximately 0. In the present specification, an AHC of about 0 indicates that the AHC is lower than a range that may be measured by a hydrogen concentration measuring apparatus. Referring to FIG. 2B, after the annealing process is performed a gap between the AHC of the hydrogen supply layer 130 and the AHC of the lower interlayer insulating layer 120 may have decreased. The AHC of the hydrogen supply layer 130 after the annealing process may be lower than before the annealing process. The AHC of the lower interlayer insulating layer 120 after the annealing process may be higher than before the annealing process. In some exemplary embodiments, after the annealing process, an AHC of the hydrogen supply layer 130 may be approximately equal to an AHC of the lower interlayer insulating layer 120.

By the annealing process, an interface charge of the transistors TR may be passivated with hydrogen, and thus, changes in a threshold voltage of the transistors TR may be reduced.

Figure 1E:
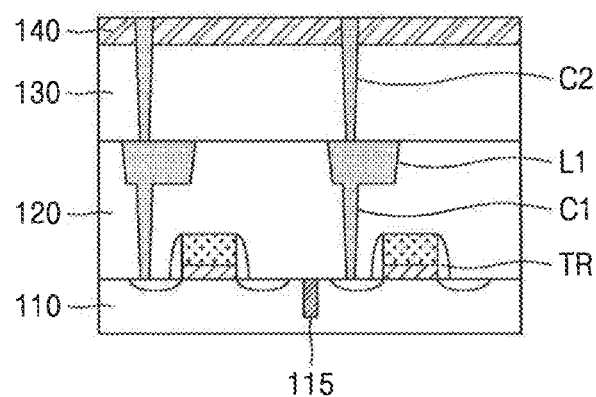

Referring to FIG. 1E, one or more second contacts C2 penetrating through the hydrogen supply layer 130 and the hydrogen blocking layer 140 may be formed. In one exemplary embodiment, the second contacts C2 may include Al, Cu, W, Au, Ag or a combination thereof. The second contacts C2 may further include barrier layers formed on surfaces of the second contacts C2. The barrier layers may include TIN, TaN or a combination thereof. In one exemplary embodiment, the second contacts C2 may be formed by a damascene process.

Figure 1F:
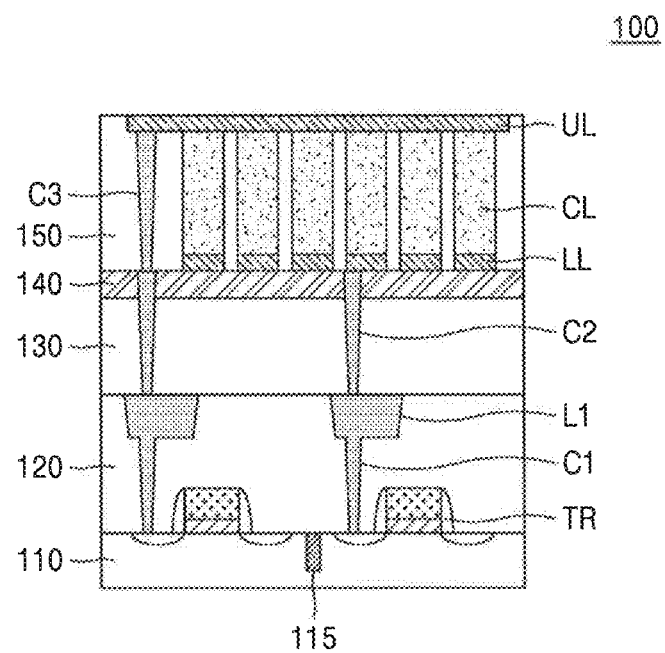

Referring to FIG. 1F, a lower conductive line ILL and at least one memory cell CL may be formed on the hydrogen blocking layer 140. In one exemplary embodiment, the memory cell CL may include a magnetoresistance change material. For example, the memory device 100 may include magnetic random access memory (MRAM). In another exemplary embodiment, the memory cell CL may include a phase-change material. For example, the memory device 100 may include phase change random access memory (PRAM). The memory cell CL may include a switch unit and a memory unit serially connected to each other.

The memory cell CL may be formed between the lower conductive line LL and an upper conductive line UL. The lower conductive line LL and the upper conductive line UL may each correspond to a bit line or a word line. In one exemplary embodiment, the lower conductive line LL and the upper conductive line UL may each include AL, Cu, W, Au, Ag or a combination thereof. The lower conductive line LL and the upper conductive line UL may further include barrier layers on surfaces of the lower conductive line LL and the upper conductive line UL. The barrier layers may include TIN, TaN or a combination thereof.

Figure 2C:
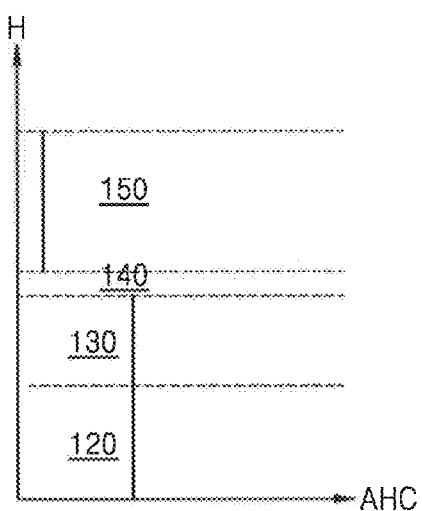
FIG. 2C is a graph of example average hydrogen concentrations after the annealing process in a memory device manufactured, according to an exemplary embodiment of the present disclosure.

An upper interlayer insulating layer 150 covering the memory cell CL may be formed. In one exemplary embodiment, the upper interlayer insulating layer 150 may include silicon oxide, silicon nitride or a combination thereof. In one exemplary embodiment, the upper interlayer insulating layer 150 may be formed by a CVD method, a PECVD method, an evaporation method, a sputtering method, an ALH method or a combination thereof. Referring to FIG. 2C, after the annealing process, an AHC of the upper interlayer insulating layer 150 may be lower than the AHC of the lower interlayer insulating layer 120 and the AHC of the hydrogen supply layer 130. In one exemplary embodiment, an AHC of the upper interlayer insulating layer 150 may be approximately 0.

In addition, at least one third contact C3 may be formed. In one exemplary embodiment, the third contact C3 may include Al, Cu, W, Au, Ag or a combination thereof. The third contact C3 may further include a barrier layer on a surface of the third contact C3. The barrier layer may include TiN, TaN or a combination thereof.

As shown in FIG. 1F, the memory device 100 manufactured according to an exemplary embodiment may include the substrate 110, the transistors TR on the substrate 110, the lower interlayer insulating layer 120 covering the transistors TR, the first conductive lines L1 in the lower interlayer insulating layer 120, the first contacts C1 connecting the first conductive lines L1 and the transistors TR, the hydrogen supply layer 130 on the lower interlayer insulating layer 120, the hydrogen blocking layer 140 on the hydrogen supply layer 130, the lower conductive line LL on the hydrogen blocking layer 140, the memory cell CL on the lower conductive line LL, the upper conductive line UL on the memory cell CL, the upper interlayer insulating layer 150 covering the memory cell, the second contacts C2 connecting the lower conductive line LL and the first conductive lines L1, and the third contact C3 connecting the upper conductive line UL and the second contacts C2.

In the method of manufacturing a memory device according to an exemplary embodiment of the present disclosure, the memory cell CL may be formed after the transistors TR are annealed. Accordingly, the method prevents the memory cells CL from being damaged by the hydrogen and heat that is needed for annealing the transistors TR.

Figure 3A:
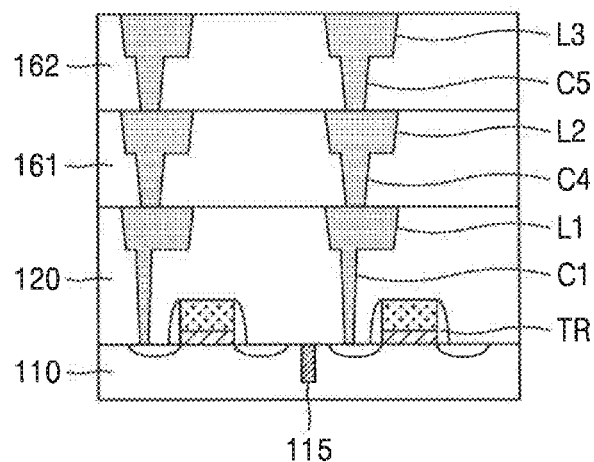
FIGS. 3A through 3D are cross-sectional views illustrating a method of manufacturing a memory device, according to an exemplary embodiment of the present disclosure.

Referring to FIG. 3A, in one exemplary embodiment, after processes shown in FIGS. 1A and 1B are performed, at least one intermediate interlayer insulating layer may be formed on the lower interlayer insulating layer 120. For example, in one exemplary embodiment, a first intermediate interlayer insulating layer 161 may be formed on the lower interlayer insulating layer 120, and a second intermediate interlayer insulating layer 162 may be formed on the first intermediate interlayer insulating layer 161. However, the number of intermediate interlayer insulating layers is not limited to two and may be variously changed.

In one exemplary embodiment, the first intermediate interlayer insulating layer 161 and the second intermediate interlayer insulating layer 162 may include silicon oxide, silicon nitride or a combination thereof. The first intermediate interlayer insulating layer 161 and/or the second intermediate interlayer insulating layer 162 may further include hydrogen atoms, in one exemplary embodiment, the first intermediate interlayer insulating layer 161 and the second intermediate interlayer insulating layer 162 may be formed by a CVD method, a PECVD method, an evaporation method, a sputtering method, an ALD method or a combination thereof.

After the first intermediate interlayer insulating layer 161 is formed, one or more second conductive lines L2 and one or more fourth contacts C4 may be formed in the first intermediate interlayer insulating layer 161. The fourth contacts C4 may connect the second conductive lines L2 to the first conductive lines L1. In one exemplary embodiment, the second conductive lines L2 and the fourth contacts C4 may each include Al, Cu, W, Au, Ag or a combination thereof. The second conductive lines L2 and the fourth contacts C4 may further include barrier layers on surfaces of the second conductive lines L2 and the fourth contact C4. The barrier layers may include TiN, TaN or a combination thereof.

After the second intermediate interlayer insulating layer 162 is formed, one or more conductive lines L3 and one or more fifth contacts C5 may be formed in the second intermediate interlayer insulating layer 162. The fifth contacts C5 may connect the third conductive lines L3 to the second conductive lines L2. In one exemplary embodiment, the third conductive lines l3 and the fifth contacts C5 may each include Al, Cu, W, Au, Ag or a combination thereof. The third conductive lines L3 and the fifth contacts C5 may further include barrier layers on surfaces of the third conductive lines L3 and the fifth contacts C5. The harrier layers may include TiN, TaN or a combination thereof.

Figure 3B:
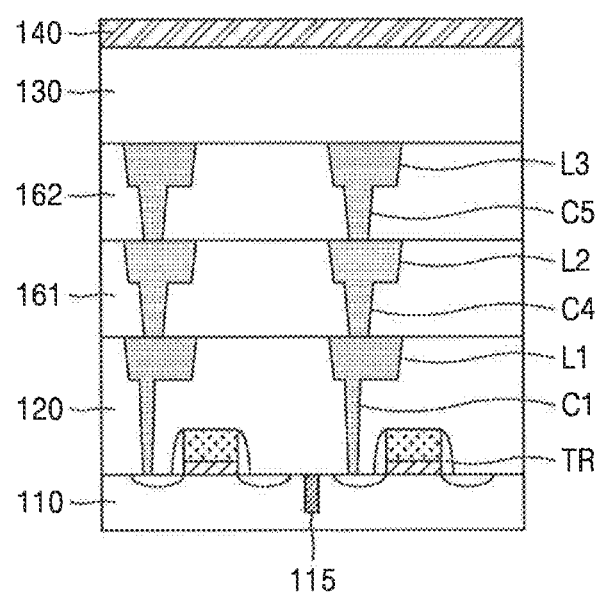
Figure 4A:
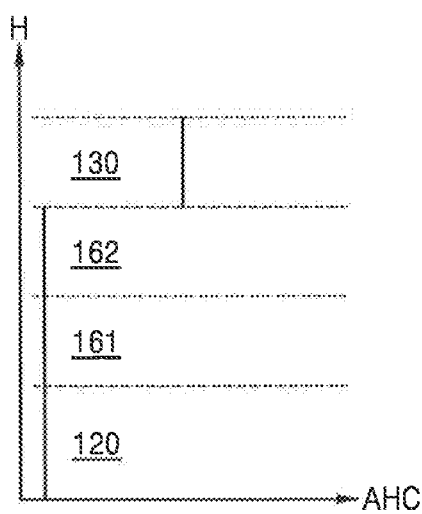
FIGS. 4A through 4C are graphs of example average hydrogen concentrations before an annealing process, according to an exemplary embodiment of the present disclosure.

Referring to FIG. 3B, the hydrogen supply layer 130 and the hydrogen blocking layer 140 may be formed on the second intermediate interlayer insulating layer 162, Referring to FIG. 4A, in one exemplary embodiment, before an annealing process, an AHC of the hydrogen supply, layer 130 may be higher than AHCs of the first intermediate interlayer insulating layer 161, the second intermediate interlayer insulating layer 162 and the lower interlayer insulating layer 120. In one exemplary embodiment, AHCs of the first intermediate interlayer insulating layer 161, the second intermediate interlayer insulating layer 162 and the lower interlayer insulating layer 120 may be approximately 0 before an annealing process.

Figure 4B:
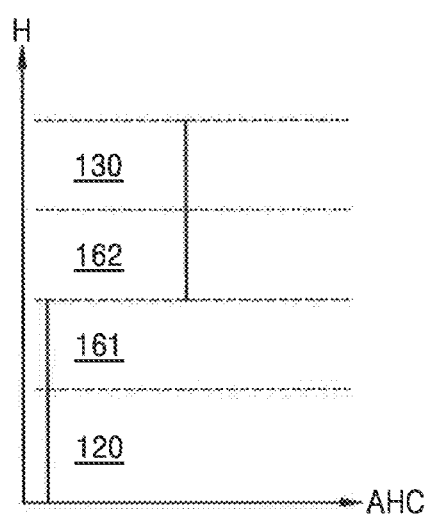

Referring to FIG. 4B, in another exemplary embodiment, AHCs of the hydrogen supply layer 130 and the second intermediate interlayer insulating layer 162 may be higher than AHCs of the first intermediate interlayer insulating layer 161 and the lower interlayer insulating layer 120 before an annealing process. In one exemplary embodiment, AHCs of the first intermediate interlayer insulating layer 161 and the lower interlayer insulating layer 120 may be approximately 0 before an annealing process.

Figure 4C:
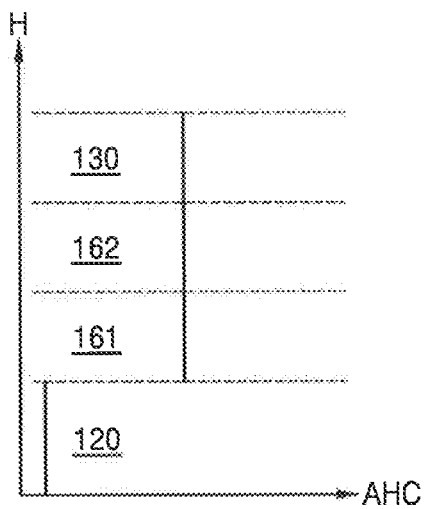
Figure 4D:
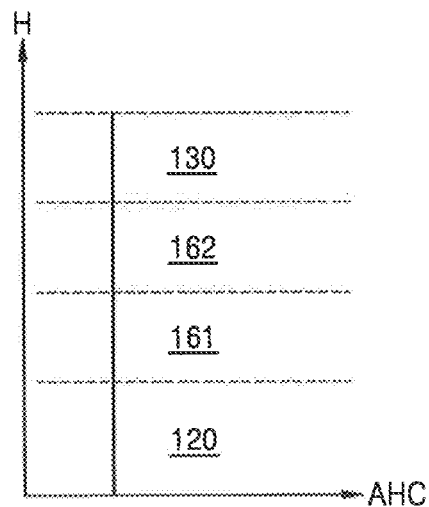
FIG. 4D is a graph of example average hydrogen concentrations after the annealing process, according to an exemplary embodiment of the present disclosure.

Referring to FIG. 4C, in one exemplary embodiment, AHCs of the hydrogen supply layer 130, the first intermediate interlayer insulating layer 161 and the second intermediate interlayer insulating layer 162 may be higher than an AHC of the lower interlayer insulating layer 120 before an annealing process. In one exemplary embodiment, an AHC of the lower interlayer insulating layer 120 may be approximately 0 before the annealing process.

The annealing process may then be performed on the transistors TR, the lower interlayer insulating layer 120, the first intermediate interlayer insulating layer 161, the second intermediate interlayer insulating layer 162 and the hydrogen supply layer 130. Referring to 4D, after the annealing process, AHCs of the hydrogen supply layer 130, the second intermediate interlayer insulating layer 162, the first intermediate interlayer insulating layer 161 and the lower interlayer insulating layer 120 may be approximately equal to one another.

Figure 3C:
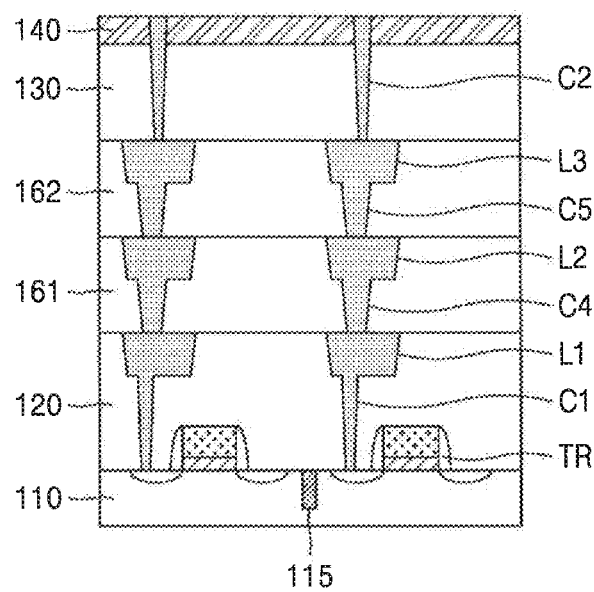

Referring to FIG. 3C, the second contacts C2 penetrating through the hydrogen supply layer 130 and the hydrogen blocking layer 140 may be formed.

Figure 3D:
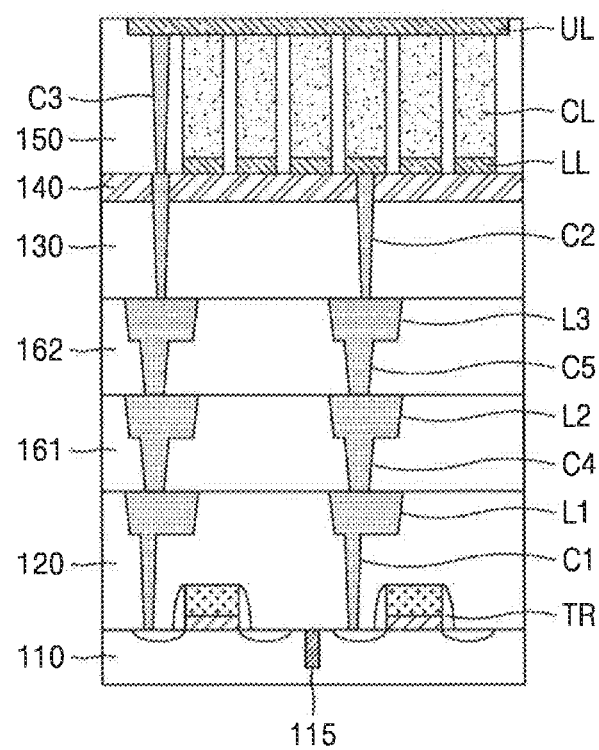

Referring to FIG. 3D, the lower conductive line LL, the memory cell CL, the upper conductive line UL, the third contact C3 and the upper interlayer insulating layer 150 may be formed on the hydrogen blocking layer 140.

As shown in FIG. 3D, the memory device 300 manufactured according to one exemplary embodiment may include the substrate 110, the transistors TR on the substrate 110, the lower interlayer insulating layer 120 covering the transistors TR, the first conductive lines L1 in the lower interlayer insulating layer 120, the first contacts C1 connecting the first conductive lines L1 and the transistors TR, the first intermediate interlayer insulating layer 161 on the lower interlayer insulating layer 120, the second conductive lines L2 in the first intermediate interlayer insulating layer 161, the fourth contacts C4 connecting the second conductive lines L2 and the first conductive lines L1, the second intermediate interlayer insulating layer 162 on the first intermediate interlayer insulating layer 161, the third conductive lines L3 in the second intermediate interlayer insulating layer 162, the fifth contacts C5 connecting the second conductive lines L2 and the third conductive lines L3, the hydrogen supply layer 130 on the second intermediate interlayer insulating layer 162, the hydrogen blocking layer 140 on the hydrogen supply layer 130, the second contacts C2 penetrating through the hydrogen supply layer 130 and the hydrogen blocking layer 140, the memory cell CL on the hydrogen blocking layer 140, the lower conductive line LL between the hydrogen blocking layer 140 and the memory cell CL, the upper conductive line UL on the memory cell, the upper interlayer insulating layer 150 covering the memory cell CL, and the third contact C3 connecting the upper conductive line UL and the second contacts C2. The memory device 300 may include at least one intermediate interlayer insulating layer, such as the first intermediate interlayer insulating layer 161 and the second intermediate interlayer insulating layer 162 positioned between the lower interlayer insulating layer 120 and the hydrogen supply layer 130, The number of intermediate interlayer insulating layers included in the memory device 300 is not limited to two.

Figure 4E:
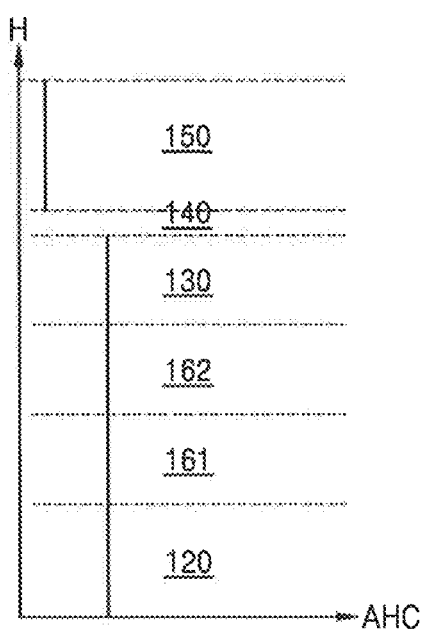
FIG. 4E is a graph of example average hydrogen concentrations after the annealing process in a memory device manufactured according to an exemplary embodiment of the present disclosure.

Referring to FIG. 4E, an AHC of the upper interlayer insulating layer 150 may be lower than AHCs of the lower interlayer insulating layer 120, the first intermediate interlayer insulating layer 161, the second intermediate interlayer insulating layer 162 and the hydrogen supply layer 130 after an annealing process. In one exemplary embodiment, an AHC of the upper interlayer insulating layer 150 may be approximately 0.

Figure 5A:
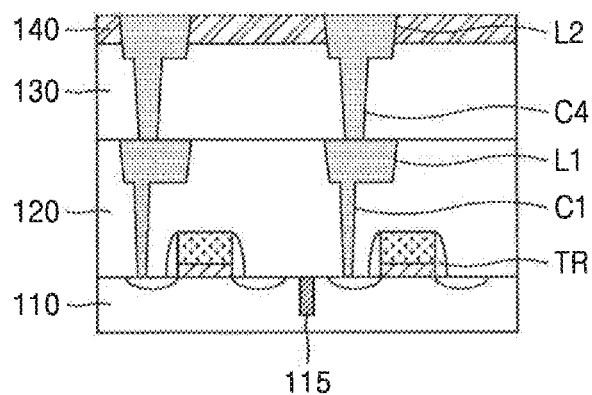
FIGS. 5A through 5D are cross-sectional views illustrating a method of manufacturing a memory device, according to an exemplary embodiment of the present disclosure.

In an exemplary embodiment, a process shown in FIG. 5A may be performed after the annealing process shown in FIG. 1D is performed. Referring to FIG. 5A, the second conductive lines L2 and the fourth contacts C4 may be formed in the hydrogen supply layer 130 and the hydrogen blocking layer 140.

Figure 5B:
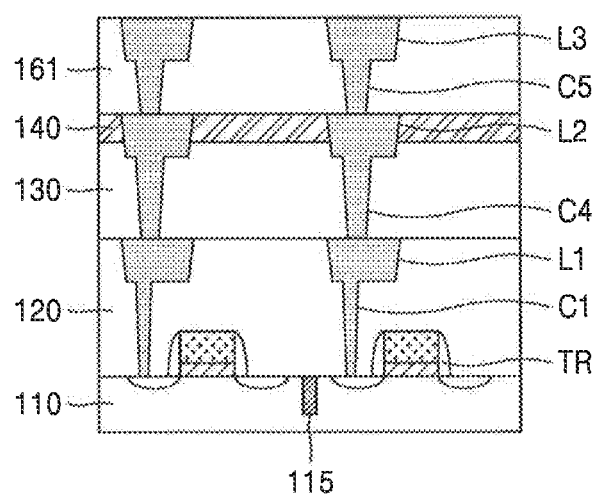
Figure 5C:
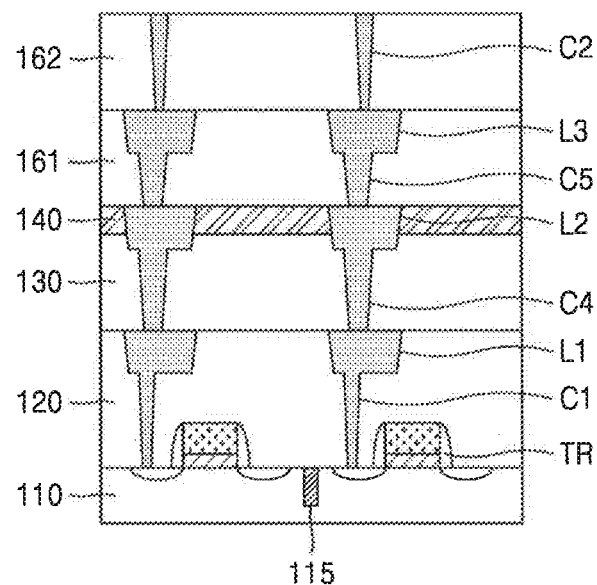

Referring to FIGS. 5B and 5C, at least one intermediate interlayer insulating layer may be formed on the hydrogen blocking layer 140. For example, the first intermediate interlayer insulating layer 161 may be formed on the hydrogen blocking layer 140, and the second intermediate interlayer insulating layer 162 may be formed on the first intermediate interlayer insulating layer 161. However, the number of the intermediate interlayer insulating layers is not limited to two and may be variously modified.

The fifth contacts C5 and the third conductive lines L3 may be formed in the first intermediate interlayer insulating layer 161. The second contacts C2 may be formed in the second intermediate interlayer insulating layer 162.

Figure 5D:
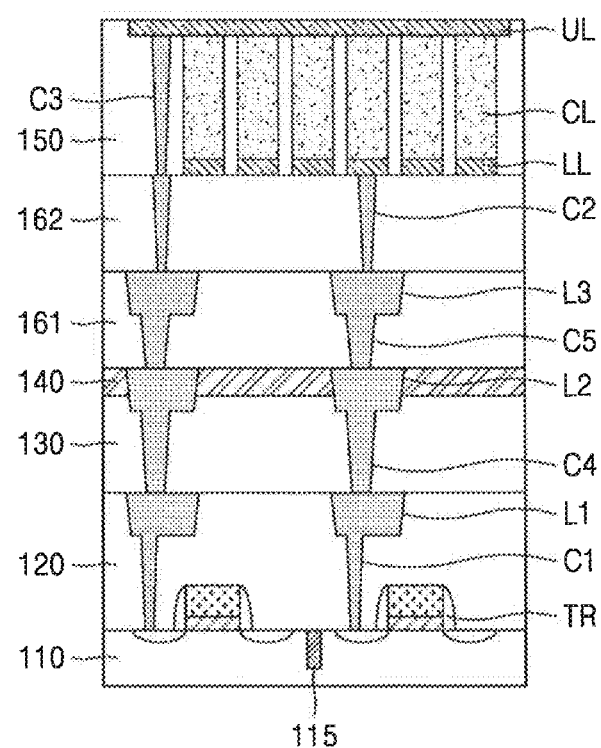

Referring to FIG. 5D, the lower conductive line LL, the memory cell CL, the upper conductive line UL, the third contact C3 and the upper interlayer insulating layer 150 may be formed on the second intermediate interlayer insulating layer 162.

As shown in FIG. 5D, a memory device 500 manufactured according to one exemplary embodiment may include the substrate 110, the transistors TR on the substrate 110, the lower interlayer insulating layer 120 covering the transistor TR, the first conductive line L1 in the lower interlayer insulating layer 120, the first contacts C1 connecting the first conductive lines L1 and the transistors TR, the second conductive lines L2 in the hydrogen blocking layer 140, the fourth contacts C4 connecting the second conductive lines L2 and the first conductive lines L1, the first intermediate interlayer insulating layer 161 on the hydrogen blocking layer 140, the third conductive lines L3 in the first intermediate interlayer insulating layer 161, the fifth contacts connecting the third conductive lines L3 and the second conductive lines L2, the second intermediate interlayer insulating layer 162 on the first intermediate interlayer insulating layer 161, the second contacts C2 penetrating through the second intermediate interlayer insulating layer 162, the lower conductive line LL on the second intermediate interlayer insulating layer 162, the memory cell CL on the lower conductive line LL, the upper conductive line UL on the memory cell CL, the upper interlayer insulating layer 150 covering the memory cell CL, and the third contact C3 connecting the upper conductive line UL and the second contacts C2.

Figure 6:
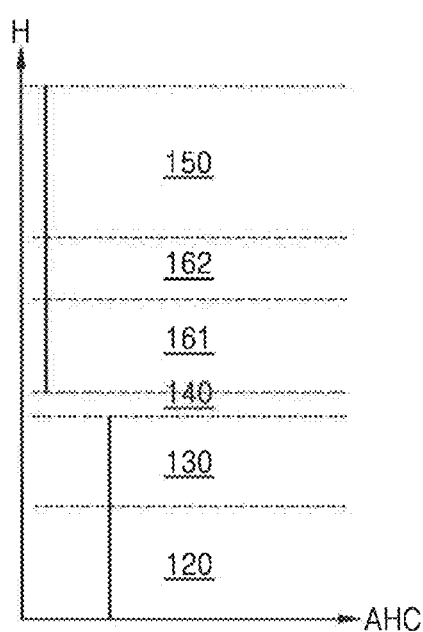
FIG. 6 is a graph of example average hydrogen concentrations in a memory device manufactured according to an exemplary embodiment of the present disclosure.

Referring to FIG. 6, AHCs of the first intermediate interlayer insulating layer 161, the second intermediate interlayer insulating layer 162 and the upper interlayer insulating layer 150 may be lower than AHCs of the lower interlayer insulating layer 120 and the hydrogen supply layer 130. In one exemplary embodiment, AHCs of the first intermediate interlayer insulating layer 161, the second intermediate interlayer insulating layer 162 and the upper interlayer insulating layer 150 may be approximately 0.

FIGS. 7A through 7E are cross-sectional views illustrating a method of manufacturing a memory device according to an embodiment of the inventive concept. MG. 8 is a graph showing example AHCs in a memory device manufactured according to an embodiment of the inventive concept.

Figure 7A:
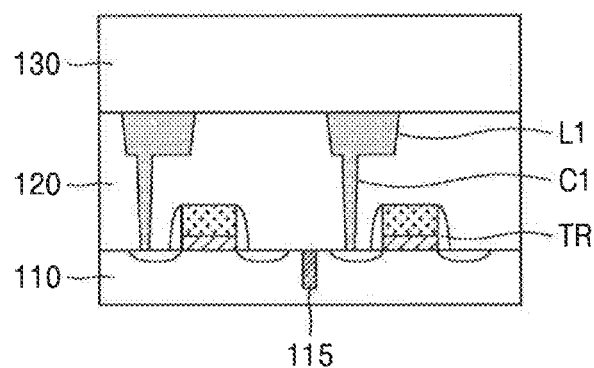
FIGS. 7A through 7E are cross-sectional views illustrating a method of manufacturing a memory device according to an exemplary embodiment of the present disclosure.

After the annealing process shown in FIG. 1D, the process shown in FIG. 5A may be performed. Referring to FIGS. 1D and 7A, the hydrogen blocking layer 140 may be removed. In one exemplary embodiment, a dry etching method, a wet etching method, a chemical mechanical polish (CMP) method or a combination thereof may be used to remove the hydrogen blocking layer 140.

Figure 7B:
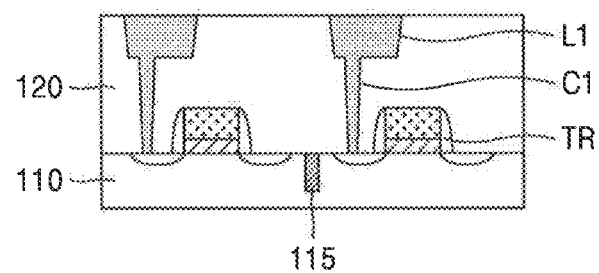

Referring to FIGS. 7A and 7B, the hydrogen supply layer 130 may be removed. In one exemplary embodiment, a dry etching method, a wet etching method, a CMP method or a combination thereof may be used to remove the hydrogen supply layer 130.

Figure 7C:
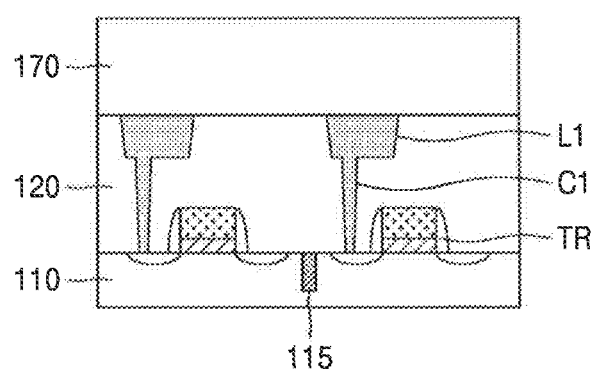

Referring to FIG. 7C, at least one additional interlayer insulating layer 170 may be formed on the lower interlayer insulating layer 120. In one exemplary embodiment, the additional interlayer insulating layer 170 may include silicon oxide, silicon nitride or a combination thereof. In one exemplary embodiment, the additional interlayer insulating layer 170 may be formed by a CVD method, a. PECVD method, an evaporation method, a sputtering method, an ALD method or a combination thereof.

Figure 7D:
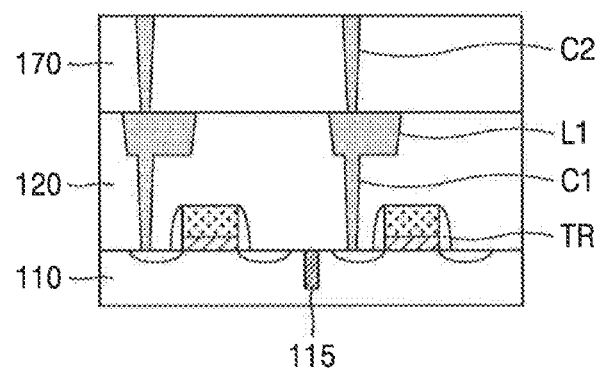

Referring to FIG. 7D, the second contact C2 penetrating through the additional interlayer insulating layer 170 may be formed.

Figure 7E:
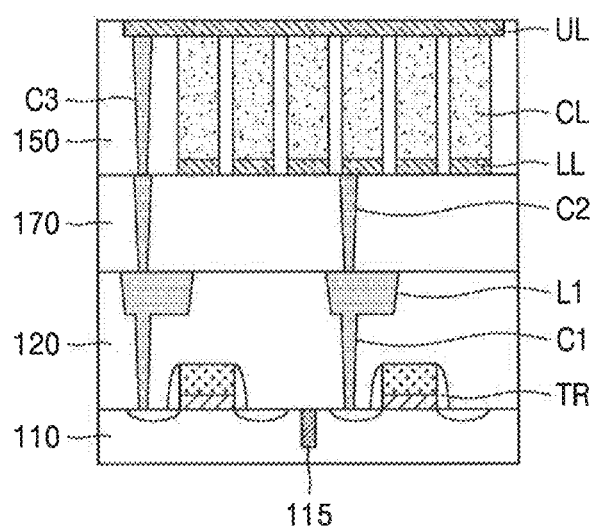

Referring to FIG. 7E, the lower conductive line LL, the memory cell CL, the upper conductive line UL, the third contact C3 and the upper interlayer insulating layer 150 may be formed on the additional interlayer insulating layer 170.

As shown in FIG. 7E, the memory device 700 manufactured according to one exemplary embodiment may include the substrate 110, the transistors TR on the substrate 110, the lower interlayer insulating layer 120 covering the transistors TR, the first conductive lines L1 in the lower interlayer insulating layer 120, the first contacts C1 connecting the first conductive line L1 and the transistors TR, the additional interlayer insulating layer 170 on the lower interlayer insulating layer 120, the second contacts C2 penetrating through the additional interlayer insulating layer 170, the lower conductive line LL on the additional interlayer insulating layer 170, the memory cell CL on the lower conductive line LL, the upper conductive line UL on the memory cell CL, the upper interlayer insulating layer 150 covering the memory cell CL, and the third contact C3 contacting the upper conductive line UL and the second contacts C2.

Figure 8:
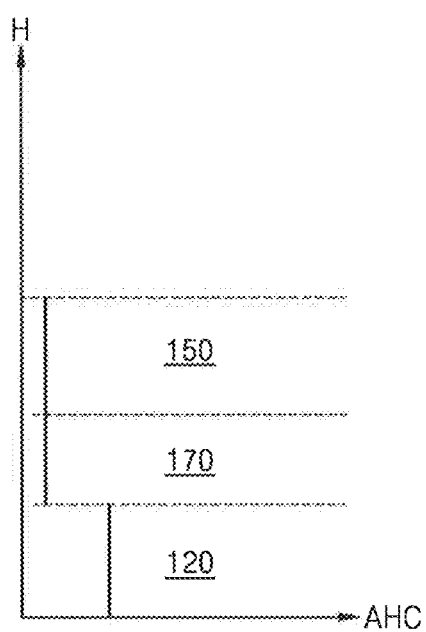
FIG. 8 is a graph of average hydrogen concentrations in a memory device manufactured according to an exemplary embodiment of the present disclosure.

Referring to FIG. 8, AHCs of the additional interlayer insulating layer 170 and the upper interlayer insulating layer 150 may be lower than an AHC of the lower interlayer insulating layer 120, In one exemplary embodiment, AHCs of the additional interlayer insulating layer 170 and the upper interlayer insulating layer 150 may be approximately 0.

While the inventive concept has been particularly shown and described with reference to example embodiments thereof, the embodiments have merely been used to explain the inventive concept and will not be construed as limiting the scope of the inventive concept. Therefore, the scope of the inventive concept is defined by the appended claims, and all technical spirits within an equivalent range thereof will be construed as being included in the scope of the inventive concept.

What is claimed is:

1. A method of manufacturing a memory device, the method comprising:
   forming a transistor on a substrate;
   forming a lower interlayer insulating layer covering the transistor;
   forming a hydrogen supply layer on the lower interlayer insulating layer;
   forming a hydrogen blocking layer on the hydrogen supply layer;
   annealing the transistor, the lower interlayer insulating layer and the hydrogen supply layer;
   forming a memory cell on the hydrogen blocking layer after the annealing of the transistor, the lower interlayer insulating layer and the hydrogen supply layer;
   forming an upper inter layer insulating layer surrounding the memory cell; and
   further comprising forming at least one intermediate interlayer insulating layer between the hydrogen supply layer and the lower interlayer insulating layer,
   wherein the at least one intermediate interlayer insulating layer comprises a first intermediate interlayer insulating layer on the lower interlayer insulation layer and a second intermediate interlayer insulating layer on the first intermediate interlayer insulating layer; and
   before annealing of the transistor, the lower interlayer insulating layer, the at least one intermediate interlayer insulating layer, and the hydrogen supply layer, an average hydrogen concentration of the second intermediate interlayer insulating layer is greater than an average hydrogen concentration of the first intermediate interlayer insulating layer.

2. The method of claim 1,
   wherein the annealing of the transistor, the lower interlayer insulating layer and the hydrogen supply layer comprises diffusing hydrogen from the hydrogen supply layer into the lower interlayer insulating layer.

3. The method of claim 1,
   wherein the annealing of the transistor, the lower interlayer insulating layer and the hydrogen supply layer is performed in a nitrogen atmosphere.

4. The method of claim 1,
   wherein the memory cell comprises a magnetoresistance change material or a phase-change material.

5. The method of claim 1, wherein:
   prior to the annealing of the transistor, the lower interlayer insulating layer and the hydrogen supply layer, the lower interlayer insulating layer has an average hydrogen concentration that is less than an average hydrogen concentration of the hydrogen supply layer; and
   after the annealing of the transistor, the lower interlayer insulating layer and the hydrogen supply layer, an upper interlayer insulating layer has an average hydrogen concentration that is less than the average hydrogen concentration of the hydrogen supply layer.

6. The method of claim 1,
   wherein the hydrogen blocking layer comprises silicon nitride.

7. The method of claim 1,
   wherein the hydrogen supply layer comprises silicon (Si), oxygen (O) and hydrogen (H).

8. The method of claim 1,
   wherein a thickness of the hydrogen blocking layer is less, than a thickness of the hydrogen supply layer.

9. A method of manufacturing a memory device, the method comprising:
   forming a transistor on a substrate;
   forming a lower interlayer insulating layer covering the transistor;
   forming at least one intermediate interlayer insulating layer on the lower interlayer insulating layer;
   forming a hydrogen supply layer on the at least one intermediate interlayer insulating layer;
   forming a hydrogen blocking layer on the hydrogen supply layer;
   annealing the transistor, the lower interlayer insulating layer, the at least one intermediate interlayer insulating layer, and the hydrogen supply layer;
   forming a memory cell on the hydrogen blocking layer after the annealing of the transistor, the lower interlayer insulating layer, the at least one intermediate interlayer insulating layer, and the hydrogen supply layer; and
   forming an upper interlayer insulating layer that surrounds the memory cell,
   wherein the at least one intermediate interlayer insulating layer comprises a first intermediate interlayer insulating layer on the lower interlayer insulating layer and a second intermediate interlayer insulating layer on the first intermediate interlayer insulating layer; and
   before the annealing of the transistor, the lower interlayer insulating layer, the at least one intermediate interlayer insulating layer, and the hydrogen supply layer, an average hydrogen concentration of the second intermediate interlayer insulating layer is greater than an average hydrogen concentration of the first intermediate interlayer insulating layer.

10. The method of claim 9, wherein:
    before the annealing of the transistor, the lower interlayer insulating layer, the at least one intermediate interlayer insulating layer, and the hydrogen supply layer, an average hydrogen concentration of the hydrogen supply layer is greater than an average hydrogen concentration of the lower interlayer insulating layer;

before the annealing of the transistor, the lower interlayer insulating layer, the at least one intermediate interlayer insulating layer, and the hydrogen supply layer, an average hydrogen concentration of at least one intermediate interlayer insulating layer is less than an average hydrogen concentration of the hydrogen supply layer; and after the annealing of the transistor, the lower interlayer insulating layer, the at least one intermediate interlayer insulating layer, and the hydrogen supply layer, an average hydrogen concentration of the upper interlayer insulating layer is less than the average hydrogen concentration of the hydrogen supply layer.

11. The method of claim 9,
wherein, before the annealing of the transistor, the lower interlayer insulating layer, the at least one intermediate interlayer insulating layer, and the hydrogen supply layer, an average hydrogen concentration of the second intermediate interlayer insulating layer is greater than an average hydrogen concentration of the lower interlayer insulating layer.

12. The method of claim 9,
wherein, before the annealing of the transistor, the lower interlayer insulating layer, the at least one intermediate interlayer insulating layer, and the hydrogen supply layer, the average hydrogen concentration of the first intermediate interlayer insulating layer is less than an average hydrogen concentration of the hydrogen supply layer.

13. The method of claim 9,
wherein, after the annealing of the transistor, the lower interlayer insulating layer, the at least one intermediate interlayer insulating layer, and the hydrogen supply layer, an average hydrogen concentration of the hydrogen supply layer is less than an average hydrogen concentration of the hydrogen supply layer before the annealing of the transistor, the lower interlayer insulating layer, the at least one intermediate interlayer insulating layer, and the hydrogen supply layer.

14. The method of claim 9,
wherein, after the annealing of the transistor, the lower interlayer insulating layer, the at least one intermediate interlayer insulating layer, and the hydrogen supply layer, an average hydrogen concentration of the lower interlayer insulating layer is greater than the average hydrogen concentration of the lower interlayer insulating layer before the annealing of the transistor, the lower interlayer insulating layer, the at least one intermediate interlayer insulating layer, and the hydrogen supply layer.

15. The method of claim 9, further comprising, forming a conductive line and a contact connecting the conductive line and the transistor in the lower interlayer insulating layer.

16. The method of claim 9, further comprising forming a contact penetrating through the hydrogen, supply layer and the hydrogen blocking layer and connected to the memory cell.

17. The method of claim 9, further comprising forming a conductive line in each of the at least one intermediate interlayer insulating layer.

18. A method of manufacturing a memory device, the method comprising:
forming a transistor on a substrate;
forming a lower interlayer insulating layer covering the transistor;
forming a hydrogen supply layer on the lower interlayer insulating layer;
forming a hydrogen blocking layer on the hydrogen supply layer;
annealing the transistor, the lower interlayer insulating layer and the hydrogen supply layer;
removing the hydrogen blocking layer; and
further comprising forming at least one intermediate interlayer insulating layer between the hydrogen supply layer and the lower interlayer insulating layer,
wherein the at least one intermediate interlayer insulating layer comprises a first intermediate interlayer insulating layer on the lower interlayer insulating layer and a second intermediate interlayer insulating layer on the first intermediate interlayer insulating layer; and
before annealing of the transistor, the lower interlayer insulating layer, the at least: one intermediate interlayer insulating layer, and the hydrogen supply layer, an average hydrogen concentration of the second intermediate interlayer insulating layer is greater than an average hydrogen concentration of the first intermediate interlayer insulating layer.

* * * * *